United States Patent
Sheu

(10) Patent No.: US 6,242,307 B1
(45) Date of Patent: Jun. 5, 2001

(54) METHOD OF FABRICATING FLASH MEMORY

(75) Inventor: Yau-Kae Sheu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/379,382

(22) Filed: Aug. 23, 1999

(51) Int. Cl.$^7$ .............................................. H01L 21/8247
(52) U.S. Cl. ........................................... 438/264; 438/286
(58) Field of Search .................................. 438/257–267, 438/286, 593–4

(56) References Cited

U.S. PATENT DOCUMENTS

| | | | |
|---|---|---|---|
| 5,620,913 | * | 4/1997 | Lee ........................................ 438/264 |
| 5,633,184 | * | 5/1997 | Tamura et al. ......................... 438/264 |
| 5,633,185 | * | 5/1997 | Yiu et al. ............................... 438/258 |
| 5,885,871 | * | 3/1999 | Chan et al. ............................ 438/265 |
| 6,015,736 | * | 1/2000 | Luning et al. ......................... 438/264 |
| 6,025,240 | * | 2/2000 | Chan et al. ............................ 438/303 |
| 6,030,869 | * | 2/2000 | Odake et al. .......................... 438/266 |
| 6,066,875 | * | 5/2000 | Chen ...................................... 257/316 |
| 6,090,670 | * | 7/2000 | Sandhu et al. ........................ 438/286 |
| 6,103,576 | * | 8/2000 | Deustche et al. ..................... 438/261 |

* cited by examiner

Primary Examiner—Richard Booth

(57) ABSTRACT

A method for fabricating a flash memory. A bar-shaped first oxide layer and a bar-shaped first conductive layer are formed on a substrate. A mask layer is formed to cover one side of the first conductive layer from portions of the top surface of the first conductive layer to portions of the surface of the substrate. A second oxide layer is formed by oxidation on the remainder of the first conductive layer and the substrate from exposed portions of top surface of the first conductive layer to the substrate not covered by the mask layer. Meanwhile, the second oxide layer in the corner jointly formed by the first conductive layer and the substrate that are not covered by the mask layer is formed in a beak shape. After stripping the mask layer and portions of the second oxide layer, a doped region between the first conductive layers is formed. Then a dielectric layer and a second conductive layer are formed in sequence on the resulting structure. Subsequently, the second conductive layer, the dielectric layer and the first conductive layer are patterned, wherein the second conductive layer and the dielectric layer are continuous bars and perpendicular to the doped region.

9 Claims, 3 Drawing Sheets

METHOD OF FABRICATING FLASH MEMORY

BACKGROUND OF THE INVENTION

1. Field of the Invention

The present invention relates to a method of fabricating a flash memory, and more particularly, to a method of fabricating a flash memory which can perform both erasing and programming by the Fowler-Nordheim tunneling effect.

2. Description of the Related Art

The gate of a conventional flash memory comprises a floating gate for charge storage and a control gate for data accessing. The floating gate is in a floating state without being connected to any electrical circuit and is located between the control gate and a substrate. The control gate is connected to a word line. FIG. 1 schematically shows an equivalent circuit diagram according to the prior art. In FIG. 1, $WL_1$ and $WL_2$ are word lines, and $BL_1$, $BL_2$, $BL_3$ and $BL_4$ are bit lines. This is an arrangement that can achieve a higher integration density currently. The operation of the arrangement is to program from a drain region in a fashion of channel hot electron injection (CHEI) and to erase from a source region in a Fowler-Nordheim (FN) tunneling fashion. However, the CHEI needs a higher voltage to operate; it thus consumes more energy. Furthermore, with respect to programming speed, the CHEI operation is faster than the FN tunneling operation, but the CHEI operation may shorten the lifetime of a flash memory cell. Thus, the overall performance of a flash memory cell that both programs and erases by the FN tunneling operation is better than that of a flash memory cell that separately programs by a CHEI operation and erases by a FN tunneling operation.

In a conventional method for fabricating a flash memory as shown in FIG. 1, an oxide layer is formed on a substrate by thermal oxidation, and a bar-shaped first polysilicon layer is formed thereon. A dielectric layer and a second polysilicon layer are formed over the substrate. Subsequently, the second polysilicon layer, the dielectric layer and the bar-shaped polysilicon layer are patterned to form a bar-shaped control gate made of the second polysilicon layer perpendicular to the bar-shaped first polysilicon layer before being patterned which has been patterned to into multiple floating gates. Since the thickness of the tunneling oxide layer between the floating gate and the substrate is uniform, it is not suitable for programming and erasing by a FN tunneling operation. This is because adjacent memory cells affect each other in FN tunneling operations and the bit-by-bit definition cannot be performed. Therefore, if the FN tunneling operation is used to program and to erase for the device design, then such arrangement of cell memories having a high integration density cannot be adopted.

SUMMARY OF THE INVENTION

Therefore, the invention provides method of fabricating a flash memory, which has a high integration density for memory cells arrangement without the requirement of a device isolation structure between neighbor memory cell.

The invention provides a method of fabricating a flash memory by the following steps. A first conductive layer covering a first oxide layer is formed on a substrate. The first conductive layer and the first oxide layer are strip-like and extend along a first direction. A mask layer is formed to extend from a part of a top surface of the first conductive layer along a sidewall there of towards a part of the substrate exposed next to the first conductive layer. Therefore, a first side of the first oxide layer is covered by the mask layer, while a second side of the first oxide layer is exposed. Using the mask layer as a mask, the exposed first conductive layer and the exposed substrate are oxidized into a second oxide layer. As a consequence, the second side of the first oxide layer is expanded to form a bird's beak. The mask layer, the second oxide layer are removed. A doped region is formed in the substrate at each side of the first conductive layer. A dielectric layer and a second conductive layer are formed on the first conductive layer and the substrate. The dielectric layer, the second conductive layer, the first conductive layer and the first oxide layer are patterned to result in a strip-like controlling gate extending along a second direction perpendicular to the first direction and an island-like floating gate made of the patterned first conductive layer.

In accordance with the invention, since the thickness of the tunneling oxide layer close to the first bar-shaped doped region and that close to the second bar-shaped doped region are different, the tunneling oxide layer can bear with different voltages at two ends. Thus, the disturbance between adjacent memory cells during programming can thereby be avoided. Therefore, the flash memory provided by the invention can perform both programming and erasing by the FN tunneling operation without affecting the integration density, and the lifetime of the flash memory is further increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 schematically shows a pattern of circuits of a flash memory having a high integration density according to the prior art.

DESCRIPTION OF THE PREFERRED EMBODIMENTS

FIG. 2A through FIG. 2E are schematic, cross-sectional views showing a process for fabricating a flash memory having a high integration density according to one preferred embodiment of this invention.

Figure 1:
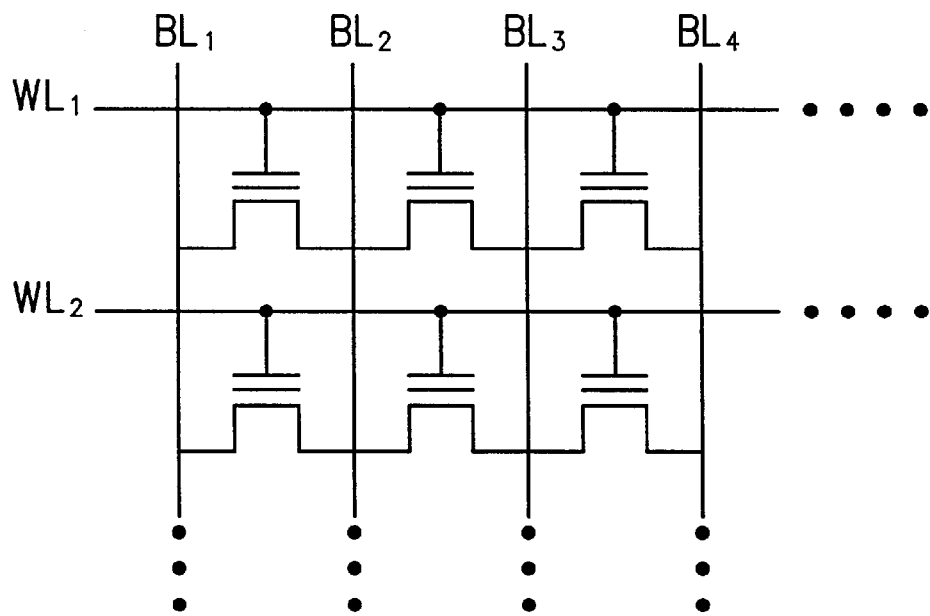
Figure 2A:
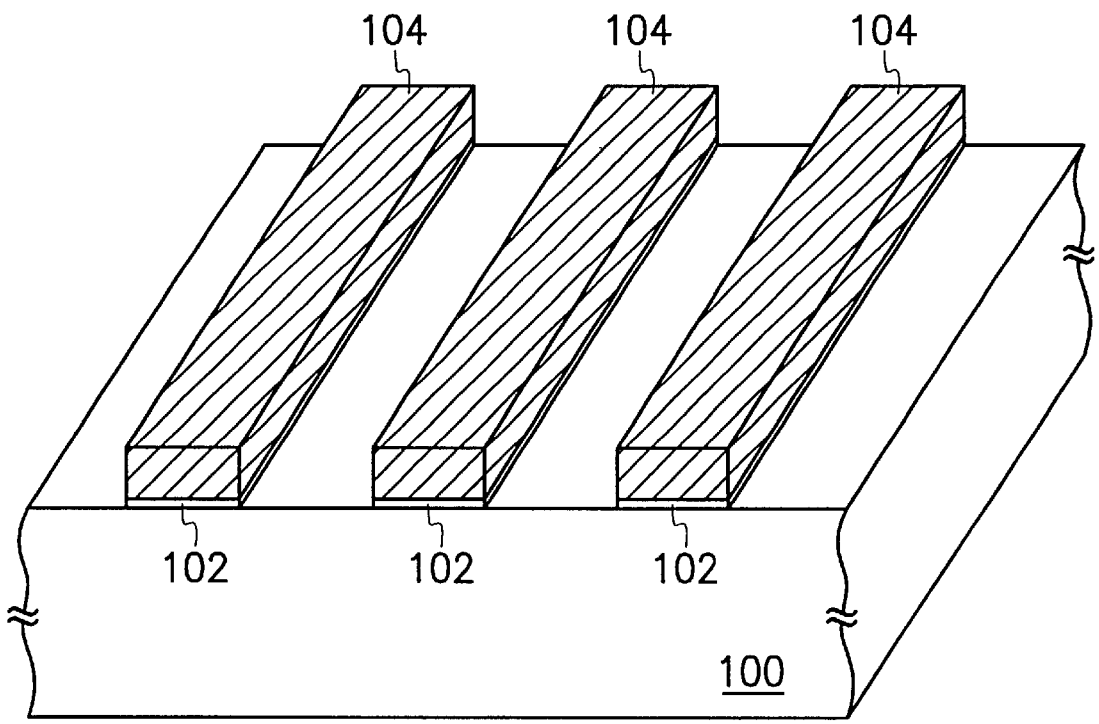
FIG. 2A through FIG. 2E are schematic, cross-sectional views showing a process for fabricating a flash memory according to one preferred embodiment of this invention.

Referring to FIG. 2A, a substrate 100 such as a silicon substrate is provided. An oxide layer is formed as a tunneling oxide layer on the substrate 100 by, for example, thermal oxidation. A conductive layer is formed on the oxide layer. The conductive layer comprises, for example, a doped polysilicon layer. The oxide layer and the conductive layer are patterned to form a bar-shaped oxide layer 102 and a bar-shaped conductive layer 104 as shown in FIG. 2A, and these two bar-shaped layers extend in a first extension direction.

Figure 2B:
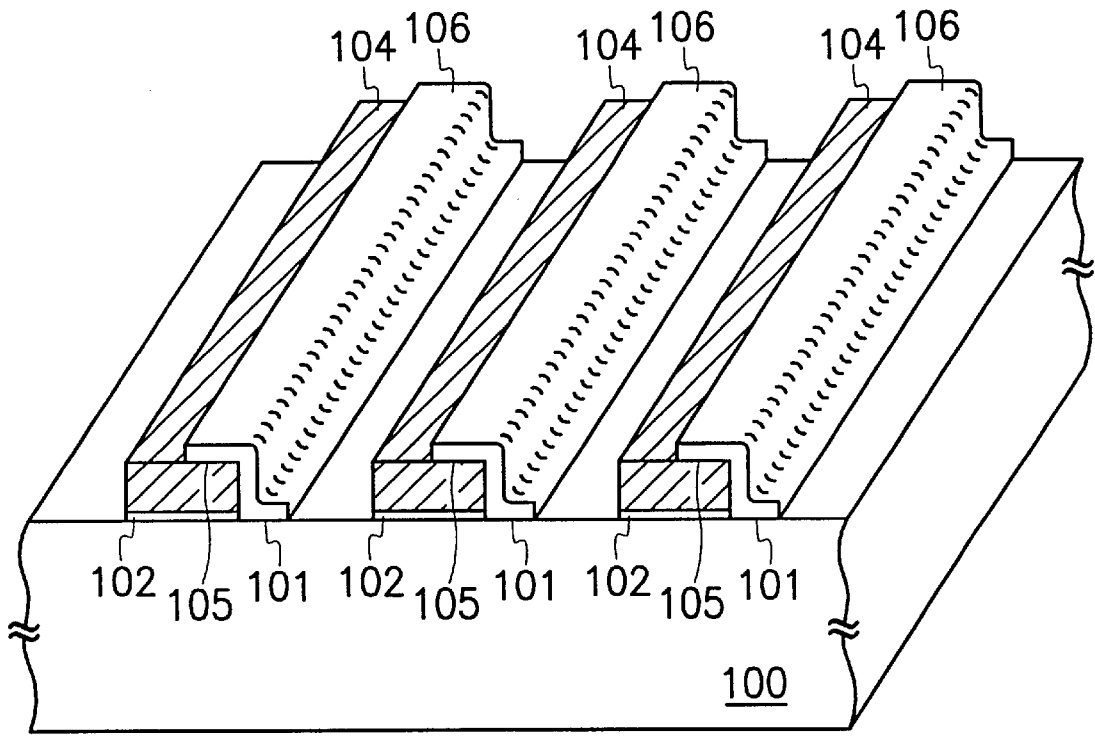

Referring to FIG. 2B, a mask layer is formed on the entire substrate. The mask layer comprises, for example, a silicon nitride layer. The silicon nitride mask layer is patterned to form a silicon nitride mask layer 106 as shown in FIG. 2B. The silicon nitride mask layer 106 covers one side of the conductive layer 104, from a portion of a top surface of the conductive layer 104 to a portion of the substrate 100, in order to protect one side of the oxide layer 102.

Figure 2C:
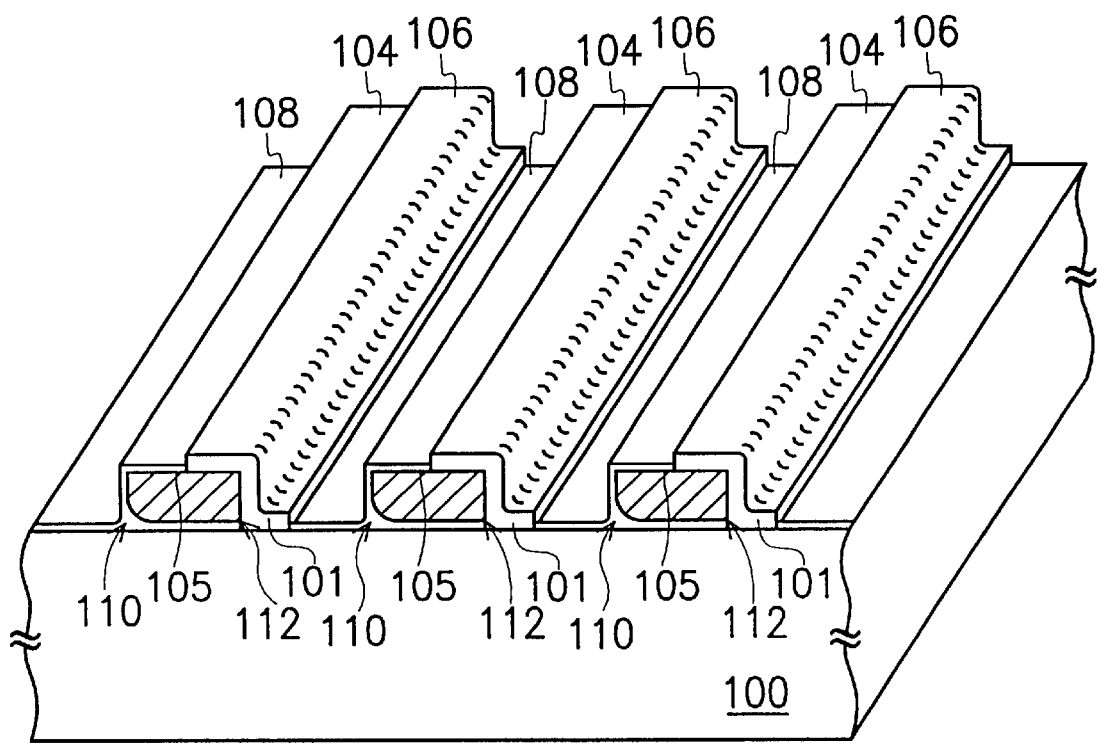

Referring to FIG. 2C, an oxide layer is formed on the surfaces of the conductive layer 104 and the substrate 100 that are not covered by the silicon nitride mask layer 106. The oxide layer and the oxide layer 102 thus join together and are denoted as an oxide layer 108. The oxide layer 108 not covered by the silicon nitride mask layer 106 and close to the substrate 100 is referred to as a corner 110, and the oxide layer 108 covered by the silicon nitride mask layer 106 and close to the substrate 100 is referred to as a corner 112. The corner 110 is oxidized into a bird's beak shape.

After the above processes, the thickness of the oxide layer 108 in the corner 110 and that in the corner 112 are different; thus, the oxide layer 108 in the corner 110 can bear with a higher voltage than that in the corner 112.

Figure 2D:
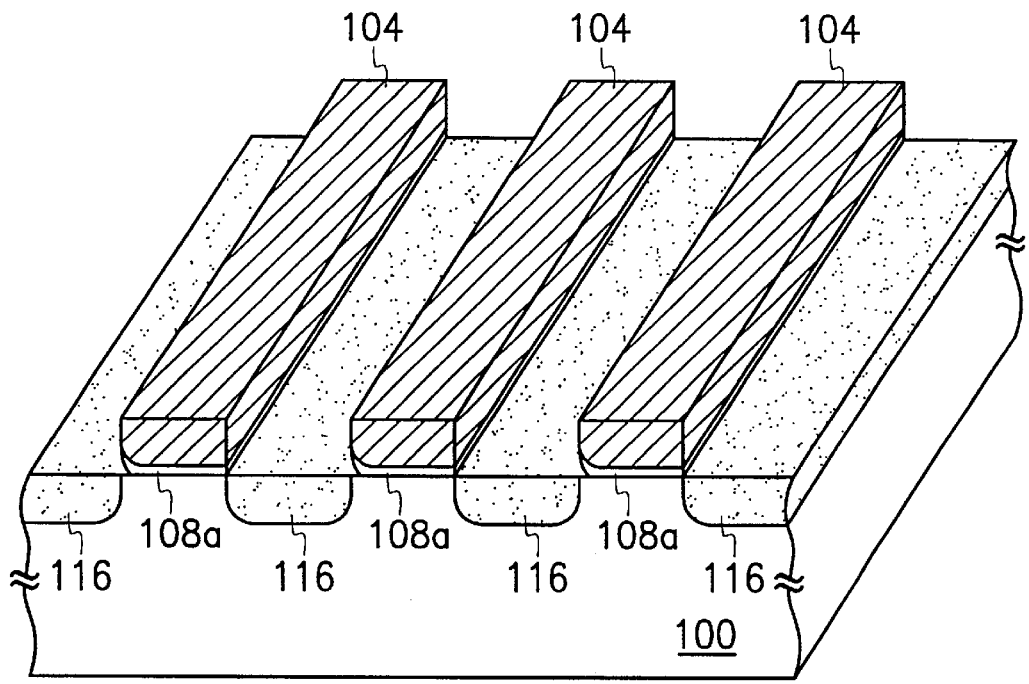

Referring to FIG. 2D, the silicon nitride mask layer 106 is stripped to expose the substrate 100 and the conductive layer 104 by, for example, wet etching using hot phosphoric acid as an etching agent. The exposed oxide layer 108 is stripped to expose the substrate 100 and the conductive layer 104 by, for example, wet etching using fluoric acid (HF) as an etching agent. Using the conductive layer 104 as a mask, ion implantation is performed to form continuous, bar-shaped doped regions 116 in the substrate 100 located at both sides of the conductive layer 104. Doped regions 116 serve as bit lines and source/drain regions. The dopant can be N-type ions.

Figure 2E:
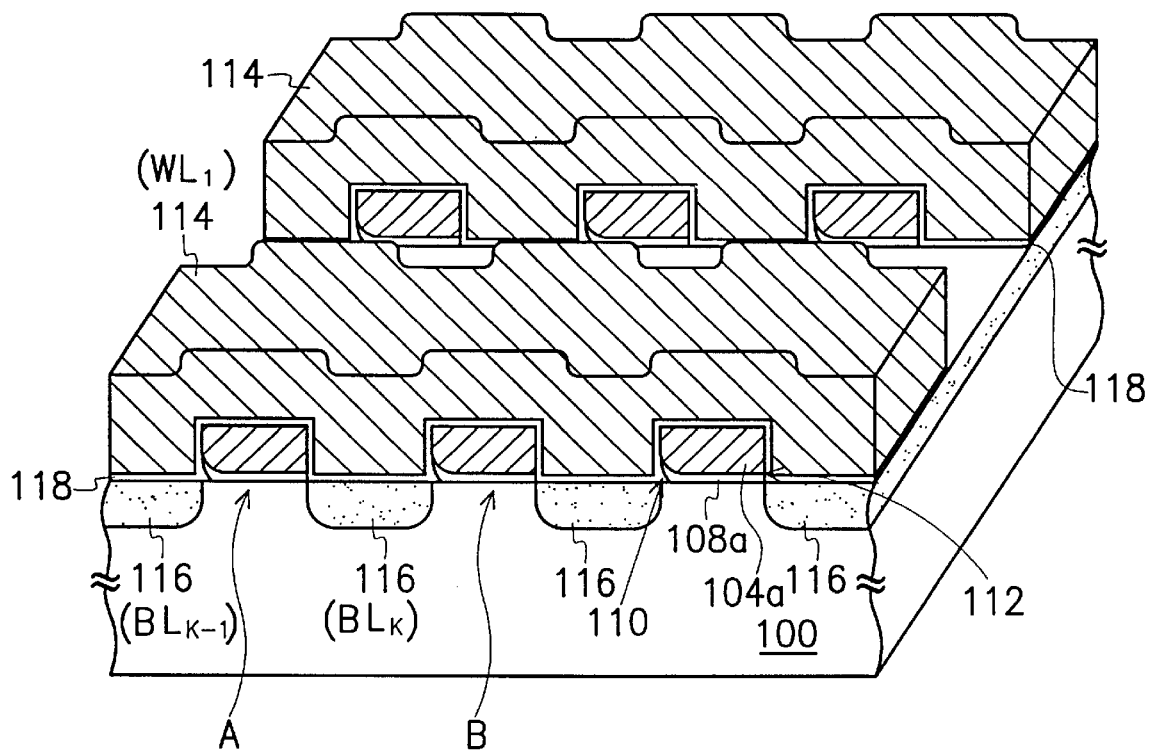

Referring to FIG. 2E, a dielectric layer is formed on the substrate 100 and the conductive layer 104. For example, the dielectric layer comprises an oxide/nitride/oxide structure. A conductive layer is formed on the dielectric layer. For example, the conductive layer comprises a doped polysilicon layer. The conductive layer, the dielectric layer and the conductive layer 104 are patterned to form a conductive layer 114, a dielectric layer 118 and a conductive layer 104a. The conductive layer 114 is bar-shaped and extends in a second extension direction that is perpendicular to the first extension direction. The conductive layer 104a is in an island or a block shape. The conductive layer 114 serves as a control gate, and the conductive layer 104a serves as a floating gate.

Therefore, according to the flash memory provided by the invention, in each memory cell, the voltage the tunneling oxide layer close to the source region can bear is different from that close to the drain region. Therefore, such stacked-gate structure with a non-uniform tunneling oxide layer of the flash memory cell without a device isolation structure can program and erase by FN tunneling operations without inducing a mutual affection between neighboring memory cells. The operations of erasing, programming and reading are, for example, shown in Table 1 with reference to FIG. 2E.

TABLE 1

|  | Erasing | Programming | Reading |
| --- | --- | --- | --- |
| Word Line, $WL_1$ | 18 V | −10 V | 5 V |
| Bit Line, $BL_K$ | 0 V | 4 V | 1.5 V |
| Bit Line, $BL_{K-1}$ | 0 V | Floating | 0 V |

For example, while programming the memory cell A, electrons are injected to the bit line $BL_K$ due to a potential difference (−14 V) between the word line $WL_1$ and the bit line $BL_K$. In this example, the drain region of the memory cell A serves as the bit line $BL_k$ which is also a drain/source region of an adjacent memory cell B, while the control gates of both the memory cells A and B both serve as the word line $WL_1$. With regard to the adjacent memory cell B, meanwhile, the potential difference between the word line $WL_1$, and the bit line $BL_K$ is also −14 V. However, the FN tunneling effect does not occur since the tunneling oxide layer 108a in the corner 110 of the floating gate 104a of the memory cell B is thicker to bear with a higher voltage, so as to block the tunneling.

The advantages of the invention comprises at least:

1. A flash memory provided by the invention can perform programming and erasing by a FN tunneling effect without affecting the integration density, and the lifetime of the flash memory further increases.

2. A flash memory provided by the invention does not have a device isolation structure.

3. In a flash memory provided by the invention, the thickness of the tunneling oxide layer close to the source region is different from that close to the drain region. Therefore, two sides of the tunneling oxide layer can bear different voltages to avoid the disturbance between adjacent memory cells during programming.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a flash memory, the method comprising:

providing a substrate;

forming a first oxide layer and a first conductive layer on the substrate, wherein the first oxide layer and the first conductive layer are in a strip shape and extends along a first direction;

forming a mask layer to cover one sidewall of the first conductive layer and the substrate next to the sidewall;

performing oxidation, so that a second oxide layer is formed on the exposed substrate and the exposed conductive layer;

stripping the mask layer and removing all of the second oxide layer not covered by the floating gate;

forming a dielectric layer and a second conductive layer on the first conductive layer and the substrate; and patterning the second conductive layer, the dielectric layer and the first conductive layer, wherein the patterned second conductive layer and the patterned dielectric layer are bar-shaped and extends along a second direction perpendicular to the first direction.

2. The method according to claim 1, wherein a material used for forming the mask layer includes silicon nitride.

3. The method according to claim 1, comprising further a step of forming two doped regions are formed in the substrate at both sides of the first conductive layer.

4. The method according to claim 3, wherein a conductivity type of the doped region is N-type.

5. The method according to claim 1, wherein a material used for forming the first conductive layer and the second conductive layer includes doped polysilicon.

6. The method according to claim 1, wherein the first oxide layer has one side with a bird's beak shape after the step of oxidation.

7. A method of fabricating a stacked gate of a flash memory with a non-uniform tunnelling oxide layer, the method comprising:

providing a substrate;

forming a tunnelling oxide layer and a first conductive layer both in a strip shape extending along a first direction on the substrate;

expanding a first side of the tunnelling oxide layer into a bird's beak shape while a second side of the tunnelling oxide remains flat to bear different voltages for the first side and the second side of the tunnelling oxide layer;

forming a dielectric layer and a second conductive layer over the substrate in sequence; and patterning the second conductive layer, the dielectric layer and the first conductive layer into a controlling gate extending along a second direction approximately perpendicular to the first direction and a floating gate in an island shape.

8. The method according to claim 7, wherein the dielectric layer includes an oxide/nitride/oxide structure.

9. The method according to claim 7, comprising further a step of forming a source/drain region at each side of the first conductive layer prior to expanding the side of the tunneling oxide layer.

* * * * *